US 8,786,051 B2

(12) United States Patent
Adkisson et al.

(10) Patent No.: US 8,786,051 B2
(45) Date of Patent: Jul. 22, 2014

(54) TRANSISTOR HAVING A MONOCRYSTALLINE CENTER SECTION AND A POLYCRYSTALLINE OUTER SECTION, AND NARROW IN-SUBSTRATE COLLECTOR REGION FOR REDUCED BASE-COLLECTOR JUNCTION CAPACITANCE

(75) Inventors: James W. Adkisson, Jericho, VT (US); David L. Harame, Essex Junction, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 13/401,064

(22) Filed: Feb. 21, 2012

(65) Prior Publication Data

US 2013/0214275 A1  Aug. 22, 2013

(51) Int. Cl.
*H01L 21/02* (2006.01)

(52) U.S. Cl.
USPC ........... 257/588; 257/197; 257/565; 257/592; 257/E29.033; 438/309; 438/341; 438/357

(58) Field of Classification Search
None
See application file for complete search history.

(56) References Cited

U.S. PATENT DOCUMENTS

| | | | |
|---|---|---|---|
| 5,266,504 A | 11/1993 | Blouse et al. | |
| 5,273,930 A * | 12/1993 | Steele et al. | 438/312 |
| 6,465,318 B1 | 10/2002 | Ehwald et al. | |
| 6,888,221 B1 | 5/2005 | Joseph et al. | |
| 7,709,930 B2 | 5/2010 | Stricker et al. | |
| 7,781,295 B1 | 8/2010 | Ramdani et al. | |
| 7,932,145 B2 | 4/2011 | John et al. | |
| 2002/0061618 A1 * | 5/2002 | Kovacic et al. | 438/235 |
| 2002/0158311 A1 * | 10/2002 | Ohnishi et al. | 257/591 |
| 2003/0109109 A1 * | 6/2003 | Freeman et al. | 438/343 |
| 2008/0265282 A1 | 10/2008 | Gluschenkov et al. | |
| 2009/0020851 A1 | 1/2009 | Liu et al. | |
| 2010/0019326 A1 | 1/2010 | Knoll et al. | |

OTHER PUBLICATIONS

Becker, et al., "Evolution of Residual Stress and Its Relation to Microstructure in Multi-Crystalline Silicon Thin Film Solar Cells on Glass Prepared by Combined Laser Crystallization and Solid Phase Epitaxy," 24th European Photovoltaic Solar Energy Conference, Sep. 21-25, 2009, Hamburg, Germany, pp. 2494-2499.
U.S. Appl. No. 13/155,730, filed Jun. 8, 2011, Cantell, et al.
U.S. Appl. No. 13/296,496, filed Nov. 15, 2011, Adkisson, et al.
U.S. Appl. No. 13/307,412, filed Nov. 30, 2011, Adkisson, et al.

* cited by examiner

*Primary Examiner* — Marcos D. Pizarro
*Assistant Examiner* — Cesar Lopez
(74) *Attorney, Agent, or Firm* — Gibb & Riley, LLC; Michael J. Le Strange, Esq.

(57) ABSTRACT

Disclosed are a transistor (e.g., bipolar junction transistor (BJT) or a heterojunction bipolar transistor (HBT)) and a method of forming the transistor with a narrow in-substrate collector region for reduced base-collector junction capacitance. The transistor has, within a substrate, a collector region positioned laterally adjacent to a trench isolation region. A relatively thin seed layer covers the trench isolation region and collector region. This seed layer has a monocrystalline center, which is aligned above and wider than the collector region (e.g., due to a solid phase epitaxy regrowth process), and a polycrystalline outer section. An intrinsic base layer is epitaxially deposited on the seed layer such that it similarly has a monocrystalline center section that is aligned above and wider than the collector region. An extrinsic base layer is the intrinsic base layer and has a monocrystalline extrinsic base-to-intrinsic base link-up region that is offset vertically from the collector region.

16 Claims, 5 Drawing Sheets

TRANSISTOR HAVING A MONOCRYSTALLINE CENTER SECTION AND A POLYCRYSTALLINE OUTER SECTION, AND NARROW IN-SUBSTRATE COLLECTOR REGION FOR REDUCED BASE-COLLECTOR JUNCTION CAPACITANCE

BACKGROUND

1. Field of the Invention

The embodiments disclosed herein relate to transistors and, more particularly, to a transistor (e.g., a bipolar junction transistor (BJT) or a heterojunction bipolar transistor (HBT)) with narrow in-substrate collector region for reduced base-collector junction capacitance $C_{bc}$ and to a method of forming the transistor.

2. Description of the Related Art

For transistors used in radio frequency (RF) applications (e.g., bipolar junction transistors (BJTs) and, particularly, for high performance heterojunction bipolar transistors (HBTs)), it is desirable to have a relatively high transit frequency $f_T$ and a relatively high maximum oscillation frequency $f_{max}$. $f_{max}$ is a function of $f_T$ and also of various parasitics, including parasitic resistances and parasitic capacitances. One such parasitic capacitance is from base-collector junction capacitance $C_{bc}$. Reduction of this base-collector junction capacitance $C_{bc}$ can result in a higher $f_{max}$. Thus, it would be advantageous to provide a transistor, such as a bipolar junction transistor (BJT) or heterojunction bipolar transistor (HBT), with reduced base-collector junction capacitance $C_{bc}$ as well as a method for forming such a transistor.

SUMMARY

In view of the foregoing, disclosed herein are embodiments of a transistor (e.g., bipolar junction transistor (BJT) or a heterojunction bipolar transistor (HBT)) and a method of forming the transistor with an in-substrate collector region having reduced dimensions (i.e., a relatively narrow in-substrate collector region) for reduced base-collector junction capacitance $C_{bc}$. Specifically, in the embodiments, the transistor can have, within a semiconductor substrate, a collector region positioned laterally adjacent to a trench isolation region. A relatively thin un-doped or low-doped seed layer can cover the trench isolation region and collector region. This seed layer can comprise a monocrystalline center section and a polycrystalline outer section. The monocrystalline center section can be aligned above and wider than the collector region (e.g., due to a solid phase epitaxy regrowth process performed during device fabrication). An intrinsic base layer can be epitaxially deposited on the seed layer such that the resulting intrinsic base layer similarly has a monocrystalline center section that is aligned above and wider than the collector region. An extrinsic base layer can be above the intrinsic base layer and can have a monocrystalline extrinsic base-to-intrinsic base link-up region that is offset vertically from the collector region. In such a transistor, narrowing the collector region increases the space between the extrinsic base layer and the collector region. As a result, base-collector junction capacitance $C_{bc}$ is reduced and, consequently, the maximum oscillation frequency $f_{max}$ is also increased.

More particularly, disclosed herein are embodiments of a transistor (e.g., bipolar junction transistor (BJT) or a heterojunction bipolar transistor (HBT)).

The transistor can comprise a semiconductor substrate. A trench isolation region can be positioned in and at the top surface of the semiconductor substrate. A collector region can also be positioned in and at the top surface of the semiconductor substrate such that it is positioned laterally adjacent to the trench isolation region.

The transistor can further comprise a conformal seed layer on the trench isolation region and the collector region. This conformal seed layer can be a relative thin semiconductor layer (e.g., a relatively thin silicon layer) and can have a first monocrystalline center section and a first polycrystalline outer section. The first monocrystalline center section can be aligned above and immediately adjacent to the collector region and can further extend laterally onto the trench isolation region such that it is wider than the collector region. The first polycrystalline outer section can be positioned laterally adjacent to the first monocrystalline center section.

The transistor can further comprise an intrinsic base layer on the seed layer. In the case of a BJT, the intrinsic base layer can comprise, for example, a silicon intrinsic base layer. Alternatively, in the case of an HBT, the intrinsic base layer can comprise a silicon germanium intrinsic base layer, a silicon germanium intrinsic base layer doped with carbon or a silicon germanium carbide intrinsic base layer. In any case, the intrinsic base layer can comprise a second monocrystalline center section and a second polycrystalline outer section. The second monocrystalline center section can be aligned above and approximately equal in size to the first monocrystalline center section of the seed layer such that it is similarly wider than the collector region in the semiconductor substrate below. The second polycrystalline outer section can be on the first polycrystalline outer section of the seed layer and can be positioned laterally adjacent to the second monocrystalline center section.

The transistor can further comprise an extrinsic base layer above the intrinsic base layer. The extrinsic base layer can comprise a monocrystalline link-up region in contact with an edge portion of the second monocrystalline center section of the intrinsic base layer and, thereby above the trench isolation region and offset vertically from the collector region.

Finally, additional features that complete the transistor can include, but are not limited to, additional dielectric layer(s), dielectric spacer(s), an emitter layer, metal silicide layer(s), contacts, etc.

Also disclosed herein are embodiments of a method of forming a transistor (e.g., bipolar junction transistor (BJT) or a heterojunction bipolar transistor (HBT), such as described above).

The method can comprise forming, in and at the top surface of a semiconductor substrate, a trench isolation region and a collector region positioned laterally adjacent to the trench isolation region.

The method can further comprise forming a conformal seed layer (e.g., a relatively thin conformal silicon layer) over the trench isolation region and collector region. This seed layer can specifically be formed such that it has a first monocrystalline center section and a first polycrystalline outer section. The first monocrystalline center section can be aligned above and immediately adjacent to the collector region and can further extend laterally onto the trench isolation region such that it is wider than the collector region below. The first polycrystalline outer section can be positioned laterally adjacent to the first monocrystalline center section.

The formation of such a seed layer can be achieved, for example, by epitaxially depositing a semiconductor layer over the collector region and trench isolation region such that the interface between monocrystalline and polycrystalline semiconductor material is aligned above the interface between the collector region and the trench isolation region.

Then, the portion of the semiconductor layer above the trench isolation region can be amorphized and a solid phase epitaxy regrowth process can be performed in order to move the interface between the monocrystalline and polycrystalline semiconductor material such that it is over the trench isolation region and, thereby offset from the interface between the collector region and the trench isolation region.

The method can further comprise forming an intrinsic base layer above the seed layer. In the case of a BJT, the intrinsic base layer formed can comprise, for example, a silicon intrinsic base layer. In the case of an HBT, the intrinsic base layer formed can comprise, for example, a silicon germanium intrinsic base layer, a silicon germanium intrinsic base layer doped with carbon or a silicon germanium carbide intrinsic base layer. In any case, the intrinsic base layer can be formed (e.g., by epitaxial deposition) such that it comprises a second monocrystalline center section and a second polycrystalline outer section. The second monocrystalline center section can be aligned above and approximately equal in size to the first monocrystalline center section of the seed layer such that it is also wider than the collector region below. The second polycrystalline outer section can be on the first polycrystalline outer section of the seed layer and positioned laterally adjacent to the second monocrystalline center section.

The method can further comprise forming an extrinsic base layer above the intrinsic base layer. The extrinsic base layer formed can comprise, for example, a silicon extrinsic base layer in the case of either a BJT or HBT. Specifically, the extrinsic base layer can be formed (e.g., by epitaxial deposition) such that it comprises a monocrystalline link-up region in contact with an edge portion of the second monocrystalline center section of the intrinsic base layer and, thereby above the trench isolation region and offset vertically from the collector region.

Finally, additional process steps can be performed to complete the transistor. These additional process steps can include, but are not limited to, the formation of additional dielectric layer(s), dielectric spacer(s), an emitter layer, metal silicide layer(s), contacts, etc.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
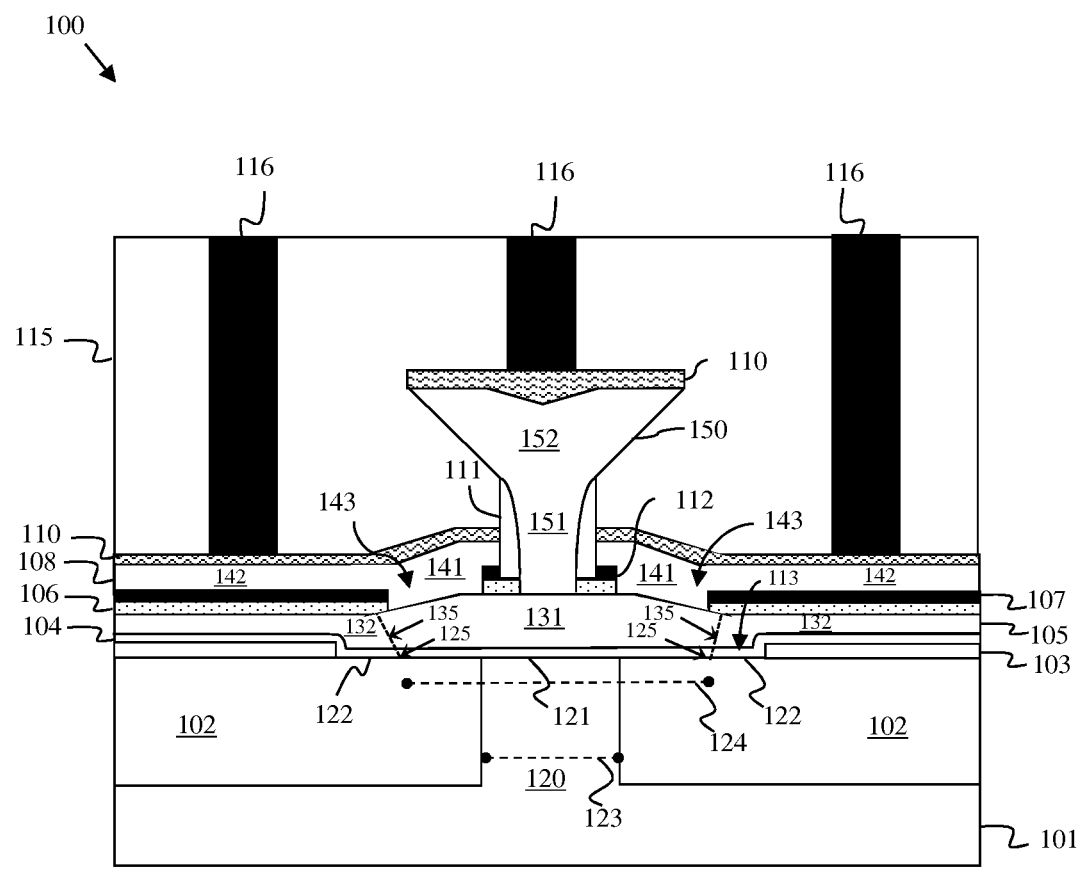
FIG. 1 is a cross-section diagram illustrating embodiments of a transistor (e.g., a bipolar junction transistor (BJT) or heterojunction bipolar transistor (HBT))

As mentioned above, for transistors used in radio frequency (RF) applications (e.g., bipolar junction transistors (BJTs) and, particularly, in high performance heterojunction bipolar transistors (HBTs)), it is desirable to have a relatively high transit frequency $f_T$ and a relatively high maximum oscillation frequency. $f_{max}$ is a function of $f_T$ and also of various parasitics, including parasitic resistances and parasitic capacitances. One such parasitic capacitance is from base-collector junction capacitance $C_{bc}$. Reduction of this base-collector junction capacitance $C_{bc}$ can result in a higher $f_{max}$.

A conventional bipolar junction transistor (BJT) or heterojunction bipolar transistor (HBT) typically comprises a collector within a semiconductor substrate and an intrinsic base, an extrinsic base and an emitter above the semiconductor substrate. Specifically, the intrinsic base can be on the surface of the semiconductor substrate above the collector. The extrinsic base can be on the intrinsic base and the emitter can comprise an essentially T-shaped emitter that has a lower portion, which extends vertically through the extrinsic base to the intrinsic base. This emitter can be electrically isolated from the extrinsic base and can be aligned above the collector. In such a transistor, the base-collector junction capacitance $C_{bc}$ can be relatively high due to the size, conductivity level and location of the collector within the semiconductor substrate relative to the extrinsic base above.

In view of the foregoing, disclosed herein are embodiments of a transistor (e.g., bipolar junction transistor (BJT) or a heterojunction bipolar transistor (HBT)) and a method of forming the transistor with an in-substrate collector region having reduced dimensions (i.e., a relatively narrow in-substrate collector region) for reduced base-collector junction capacitance $C_{bc}$. Specifically, in the embodiments, the transistor can have, within a semiconductor substrate, a collector region positioned laterally adjacent to a trench isolation region. A relatively thin un-doped or low-doped seed layer can cover the trench isolation region and collector region. This seed layer can comprise a monocrystalline center section and a polycrystalline outer section. The monocrystalline center section can be aligned above and wider than the collector region (e.g., due to a solid phase epitaxy regrowth process performed during device fabrication). An intrinsic base layer can be epitaxially deposited on the seed layer such that the resulting intrinsic base layer similarly has a monocrystalline center section that is aligned above and wider than the collector region. An extrinsic base layer can be above the intrinsic base layer and can have a monocrystalline extrinsic base-to-intrinsic base link-up region that is offset vertically from the collector region. In such a transistor, narrowing the collector region increases the space between the extrinsic base layer and the collector region. As a result, base-collector junction capacitance $C_{bc}$ is reduced and, consequently, the maximum oscillation frequency $f_{max}$ is also increased.

More particularly, referring to FIG. 1, disclosed herein are embodiments of a transistor 100. This transistor 100 can comprise, for example, a bipolar junction transistor (BJT). Alternatively, this transistor 100 can comprise a heterojunction bipolar transistor (HBT).

In any case, this transistor 100 can comprise at least a semiconductor substrate 101. The semiconductor substrate 101 can comprise a monocrystalline semiconductor material. For example, the semiconductor substrate 101 can comprise a bulk silicon substrate or any other suitable bulk semiconductor substrate, as illustrated in FIG. 1. Alternatively, the semiconductor substrate 101 can comprise a semiconductor layer of a semiconductor-on-insulator (SOI) wafer (e.g., a silicon layer of a silicon-on-insulator (SOI) wafer) (not shown). The semiconductor substrate 101 can have a first type conductivity (e.g., a P-type conductivity). Thus, for example, the semiconductor substrate 101 can comprise a P− silicon substrate (i.e., a silicon substrate having a relatively low concentration of a P-type dopant).

The transistor 100 can further comprise a trench isolation region 102 and a collector region 120. The trench isolation region 102 can comprise a shallow trench isolation (STI) region 102 within and at the top surface of the semiconductor substrate 101. The collector region 120 can also be within and at the top surface of the substrate 101 such that it positioned laterally adjacent to the STI region 102.

Specifically, collector region 120 can comprise a doped region that is within the semiconductor substrate 101 and that has a second type conductivity that is different from the first type conductivity (e.g., an N-type conductivity). This collector region 120 can comprise a single N-well region. Alternatively, the collector region 120 can comprise multiple N-type collector components, having different doping concentrations and, thereby different conductivity levels. For example, the collector region 120 can comprise the following collector components described and illustrated in U.S. Patent Publication No. 2008/0265282 of Gluschenkov et al., published on Oct. 30, 2008, assigned to International Business Machines Corporation, and incorporated herein by reference: a N+ buried collector within the semiconductor substrate; a N− collector above the N+ buried collector and extending to the top surface of the semiconductor substrate; and an N+ selective implant collector (SIC) within the N-collector immediately adjacent to the N+ buried collector and separated from the top surface of the substrate by some distance.

The STI region 102 can border (i.e., laterally surround) and, thereby define the dimensions (e.g., the length (not shown) and the width 123) of the collector region 120. This STI region 102 can comprise, for example, a conventional STI region comprising a relatively shallow trench filled with one or more isolation materials (e.g., silicon dioxide ($SiO_2$), silicon nitride (SiN), silicon oxynitride (SiON) or any other suitable isolation material or combination thereof).

At least one mask layer 103 (e.g., a polysilicon or dielectric mask layer) can be positioned on the top surface of the semiconductor substrate 101. This mask layer can 103 can have an opening 113 (i.e., a trench), which is aligned above and exposes the top surface of the collector region 120 and which also exposes a portion of the top surface of the STI region 102 immediately adjacent to and laterally surrounding the collector region 120.

The transistor 100 can further comprise a seed layer 104 covering the mask layer 103 and lining the opening 113 such that it is also above and immediately adjacent to the exposed portion of the top surface of the STI region 102 as well as the top surface of the collector region 120. This seed layer 104 can be a relatively thin epitaxial semiconductor layer (e.g., an epitaxial silicon layer with a maximum thickness of less than 200 nm). This seed layer 104 can further have a first monocrystalline center section 121 and a first polycrystalline outer section 122.

Specifically, the first monocrystalline center section 121 of the seed layer 104 can aligned above and immediately adjacent to the collector region 120 and can further extend laterally onto the top surface of the trench isolation region 102. Thus, the first monocrystalline center section 121 has a width 124 that is greater than the width 123 of the collector region 120. Specifically, the width 124 of the first monocrystalline center section 121 can be greater than the width 123 of the collector region 120, as defined by the STI region 102, by a predetermined number of units distance (e.g., by 40 nm, 60 nm, 80 nm, etc.). This predetermined number of units distance will depend upon the solid phase epitaxy regrowth processing time used during manufacture, see detailed discussion below with regard to the method embodiments. The first polycrystalline outer section 122 can be positioned laterally adjacent to the first monocrystalline center section 121 and, more particularly, can border (i.e., laterally surround) the first monocrystalline center section 121. It should be noted that the interface 125 between the first monocrystalline center section 121 and the first polysilicon outer section 122 can be within the opening 113 above the trench isolation region 102, as illustrated, or, alternatively, can be outside the opening 113 above the mask layer 103.

The seed layer 104 can be un-doped such that it has neither an N-type conductivity, nor a P-type conductivity. Alternatively, this seed layer 104 can be doped with a relatively low concentration of a second type conductivity dopant (e.g., an N-type dopant) such that it has the same type conductivity as the collector region 120, but at a lower conductivity level. For example, the seed layer can comprise an N− semiconductor layer (e.g., an N− silicon layer) with the monocrystalline and polycrystalline sections 121, 122, as described above.

It should be noted that during transistor formation, as discussed in greater detail below with regard to the method embodiments, amorphization implant and solid phase epitaxy regrowth processes are performed in order to ensure that the first monocrystalline center section 121 of the seed layer 104 extends laterally onto the trench isolation region 102. Specifically, the amorphization implant and solid phase epitaxy regrowth processes are performed to ensure that the interface 125 between the monocrystalline and polycrystalline sections 121, 122 of the seed layer 104 is above the STI region 102 (or mask layer 103), as discussed above, and not aligned above the interface between the STI region 102 and the collector region 120. During the amorphization implant process, the inner portion of the first monocrystalline center section 121 of the seed layer above collector region 120 is masked. Thus, in the resulting transistor 100, all portions of the seed layer 104, except the inner portion of the first monocrystalline center section 121 above the collector region 120, are doped with inert amorphization ions. That is, the entire first polycrystalline outer section 122 and the edge portion of the first monocrystalline center section 121 are doped with inert amorphization ions and the inner portion of the first monocrystalline center section 121 is devoid of such amorphization ions. The inert amorphization ions can comprise, for example, any of the Group IV ions (e.g., silicon ions, germanium ions, carbon ions or tin ions), any of the Group 0 nobel gas ions (e.g., argon ions, krypton ions, xenon ions, and neon ions), nitrogen ions, oxygen ions, or any combination thereof.

The transistor 100 can further comprise an intrinsic base layer 105. In the case of a BJT, this intrinsic base layer can comprise, for example, an epitaxial silicon intrinsic base layer. In the case of an HBT, this intrinsic base layer 105 can comprise, for example, an epitaxial silicon germanium intrinsic base layer, an epitaxial silicon germanium intrinsic base layer doped with carbon or an epitaxial silicon germanium carbide intrinsic base layer In any case, the intrinsic base layer 105 can be grown from the seed layer 104 (e.g., using an non-selective epitaxial deposition process, as discussed in greater detail below with regard to the method embodiments) such that it has a second monocrystalline center section 131 above the first monocrystalline center section 121 of the seed layer 104 and a second polycrystalline outer section 132 above the first polycrystalline outer section 122 of the seed layer 104. Thus, the second monocrystalline center section 131 is similarly aligned above and wider than the collector region 120. The intrinsic base layer 105 may, optionally, have a relatively thin un-doped lower portion that it has neither N-type, nor P-type conductivity and further may a relatively thin upper portion that is doped (in-situ or subsequently) with a specific concentration of a first type conductivity dopant (e.g., a P-type dopant) such that it has the same type conductivity as the substrate 101 (e.g., P-type conductivity). Those skilled in the art will recognize that, when a non-selective epitaxy process is used to form the intrinsic base layer 105, the resulting monocrystalline center section 131 will typically grow faster and, thereby be thicker than the polycrystalline outer section 132.

The transistor 100 can further comprise a stack of one or more additional mask layer(s) 106, 107 positioned on the intrinsic base layer 105. For example, a dielectric mask layer 106 can be positioned immediately adjacent to the intrinsic base 105 and can comprise, for example, a silicon dioxide ($SiO_2$) layer, a silicon nitride (SiN) layer, a silicon oxynitride (SiNO), a high-K dielectric layer (e.g., hafnium oxide ($HFO_2$), zirconium oxide (ZrO2), etc.), or any other suitable dielectric layer capable of blocking dopant diffusion. A polysilicon mask layer 107 or other suitable mask layer can be positioned above the dielectric mask layer 106. An opening 143 can extend vertically through the additional mask layer(s) 106, 107 to the intrinsic base layer 105. This opening 143 can expose only the edge portion of the second monocrystalline center section 131 above the STI region 102, thereby leaving a inner mask portion (also referred to herein as an emitter opening landing pad 112) on the inner portion of the second monocrystalline center section 131 essentially centered above collector region 120 and an outer mask portion on the second polycrystalline outer section 132.

The transistor 100 can further comprise a raised extrinsic base layer 108 positioned above the additional mask layer(s) 106, 107 and filling the opening 143. This raised extrinsic base layer 108 can comprise yet another epitaxial semiconductor layer (e.g., an epitaxial silicon layer in the case of either a BJT or HBT) and can have a third monocrystalline section 141 (i.e., a monocrystalline extrinsic base-to-intrinsic base link-up region) and a third polycrystalline outer section 142.

Specifically, the third monocrystalline section 141 can fill the opening 143 such that it is aligned above and immediately adjacent to (i.e., in contact with) the edge portion of the second monocrystalline center section 131 of the intrinsic base layer 105, thereby forming a monocrystalline extrinsic base-to-intrinsic base link-up region above the STI region 102 and offset vertically from the collector region 120. The third polycrystalline outer section 142 can be positioned laterally adjacent to the third monocrystalline center section 141 and above the additional mask layer(s) 106, 107. The raised extrinsic base layer 108 can have the first type conductivity (e.g., P-type conductivity). Furthermore, the concentration of first type conductivity dopant (e.g., P-type dopant) in the raised extrinsic base layer 108 can be relatively high as compared to the concentration of the same type conductivity dopant in the intrinsic base layer 105, if applicable, or the semiconductor substrate 101.

As with conventional bipolar junction transistors (BJTs) and conventional heterojunction bipolar transistors (HBTs), the transistor 100 disclosed herein can further comprise additional features including, but not limited to, an emitter layer, dielectric spacers, metal silicide layer(s), contacts, etc. Various different configurations for these additional features are well known in the art and can be incorporated into different embodiments of the transistor 100.

For example, as shown in FIG. 1, in one exemplary embodiment, the transistor 100 can further comprise an emitter layer 150, dielectric spacers 111, metal silicide layers 110, additional dielectric layer(s) 115, contacts 116, etc.

The emitter layer 150 (e.g., an essentially T-shaped emitter layer) can be positioned above the second monocrystalline center section 131 of the intrinsic base layer 105. Specifically, the emitter layer 150 can have a lower portion 151 that extends vertically through the raised extrinsic base layer 108 and the emitter opening landing pad 112 to the second monocrystalline center section 131 of the intrinsic base layer 105. At least one dielectric spacer 111 can be positioned in the emitter opening and can surround the lower portion 151 of the emitter layer 150 so as to electrically isolate it from the raised extrinsic base layer 108. The dielectric spacer(s) 111 can comprise a dielectric material, such as silicon nitride (SiN), silicon oxynitride (SiON) or any other suitable dielectric material. The emitter layer 150 can further have an upper portion 152, which is above and wider than the lower portion 151 such that it extends laterally over at least the dielectric spacer(s) 111. The emitter layer 150 can comprise, for example, a polycrystalline semiconductor layer (e.g., a polycrystalline silicon layer) having the same second type conductivity as the collector region 120 (e.g., N-type conductivity).

A metal silicide layer 110 can be positioned on the top surface of the raised extrinsic base layer 108 and, particularly, over the third polycrystalline outer section 142 of the raised extrinsic base layer 108. Optionally, this metal silicide layer 110 can further extend laterally over the third monocrystalline section 141 of the raised extrinsic base layer 108. Additionally, a metal silicide layer 110 can be positioned on the top surface of the upper portion 152 of the emitter layer 150. Such metal silicide layers 110 can comprise silicides of, for example, a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. It should be noted that, if applicable, the dielectric spacer 111 can also isolate the lower portion of the emitter layer 150 from any metal silicide layer 110 on the raised extrinsic base layer 108.

One or more additional dielectric layer(s) 115 can blanket (i.e., cover) the transistor 100, as described above. These additional dielectric layer(s) can comprise, for example, any suitable interlayer dielectric material(s). For example, the additional dielectric layer(s) 115 can comprise any of silicon dioxide ($SiO_2$), silicon nitride (SiN), borophosphosilicate glass (BPSG), etc. Finally, contacts 116 can extend vertically through the dielectric layer(s) 115 in order to contact the raised extrinsic base layer 108, the emitter layer 150, etc.

In such a transistor 100, narrowing the collector region 120 increases the space between the extrinsic base layer 108 and the collector region 120, and reduces their overlapping area. As a result, base-collector junction capacitance $C_{bc}$ is reduced and, consequently, the maximum oscillation frequency $f_{max}$ is also increased. Furthermore, this reduced $C_{bc}$ is achieved without requiring a corresponding decrease in the size of the monocrystalline center section 131 of the intrinsic base layer 105, the emitter landing pad 112 or the emitter layer 150.

Figure 2:
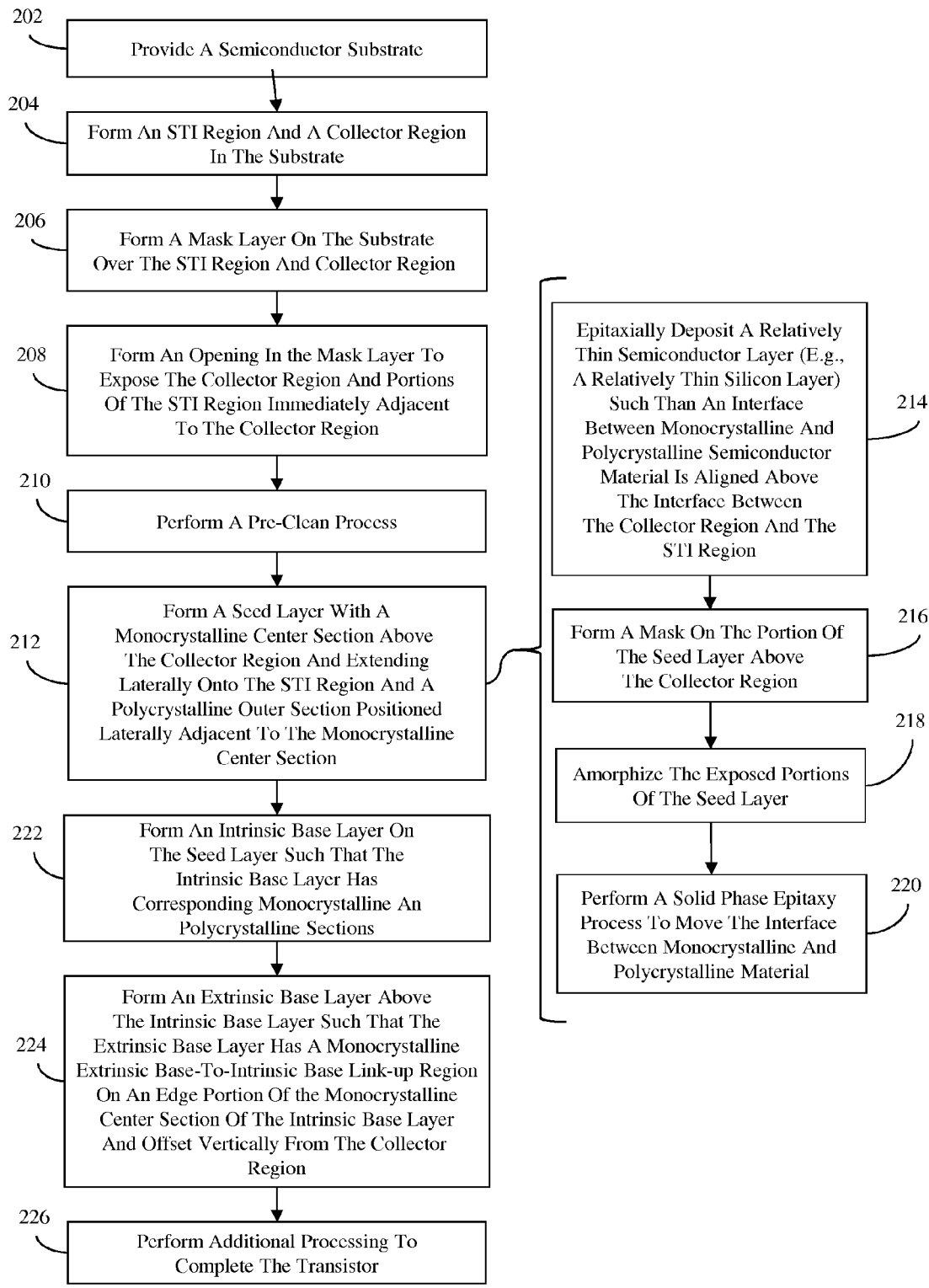
FIG. 2 is a flow diagram illustrating embodiments of a method of forming the BJT or HBT of FIG. 1.

Referring to FIG. 2, also disclosed herein are embodiments of a method of forming a transistor 100 (e.g., bipolar junction transistor (BJT) or a heterojunction bipolar transistor (HBT)), such as that described in detail above and illustrated in FIG. 1.

Figure 3:
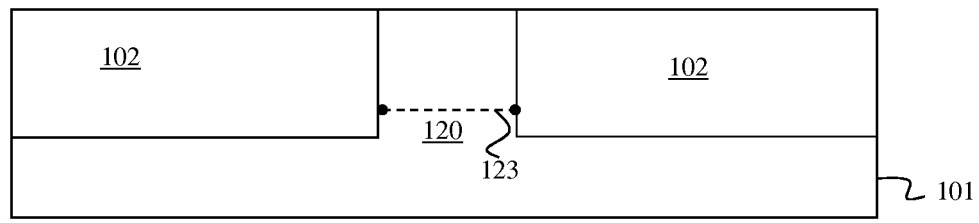
FIG. 3 is a cross-section diagram illustrating a partially completed BJT or HBT formed according to the method of FIG. 2.

The method embodiments can comprise providing a semiconductor substrate 101 (202). This semiconductor substrate 101 can comprise a monocrystalline semiconductor material. For example, the semiconductor substrate 101 can comprise a bulk silicon substrate or any other suitable bulk semiconductor substrate, as illustrated in FIG. 3. Alternatively, the semiconductor substrate 101 can comprise a semiconductor layer of a semiconductor-on-insulator (SOI) wafer (e.g., a silicon layer of a silicon-on-insulator (SOI) wafer) (not shown). In any case, the semiconductor substrate 101 can have a first type conductivity (e.g., a P-type conductivity). Thus, for example, the semiconductor substrate 101 can comprise a P−silicon substrate (i.e., a silicon substrate having a relatively low concentration of a P-type dopant).

A shallow trench isolation (STI) region 102 can be formed within and at the top surface of the semiconductor substrate 101 so as to define the active area of the transistor structure 100 (204, see FIG. 3). The STI region 102 can be formed using conventional shallow trench isolation (STI) formation techniques. For example, a trench can be lithographically patterned and etched into the semiconductor substrate 101 so as to define the active region. The trench can then be filled with one or more isolation materials (e.g., silicon oxide ($SiO_2$), silicon nitride (SiN), silicon oxynitride (SiON) or any other suitable isolation materials).

Additionally, a collector region 120 can be formed within the active area of the semiconductor substrate 101, as defined by the STI region 102 (204, see FIG. 3). Thus, the STI region 102 defines the dimensions (e.g., the length (not shown) and the width 123) of the collector region 120. This collector region 120 can be formed (e.g., implanted with a dopant) so as to have a second type conductivity that is different from the first type conductivity of the substrate (e.g., an N-type conductivity). Various different techniques for forming BJT and HBT collector regions having different configurations are well known in the art and can be incorporated into the method embodiments disclosed herein. For example, the collector region 120 can be formed as a single N-well region within the substrate 101. Alternatively, the collector region 120 can be formed as multiple N-type collector components, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; a N−collector above the N+ buried collector and extending to the top surface of the substrate; and an N+ selective implant collector (SIC) within the N− collector immediately adjacent to the N+ buried collector and separated from the top surface of the substrate by some distance.

Figure 4:
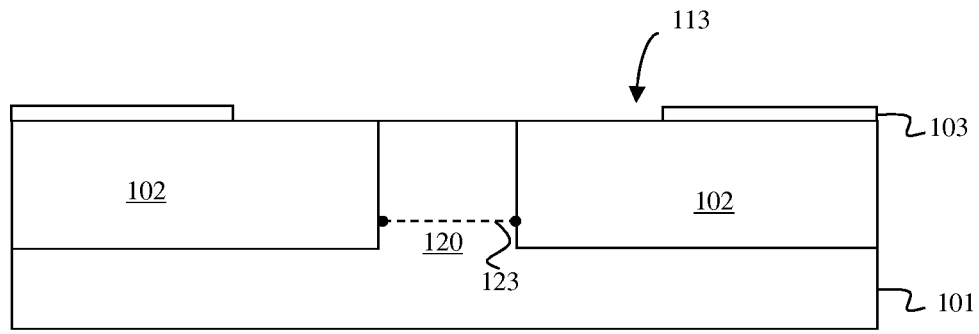
FIG. 4 is a cross-section diagram illustrating a partially completed BJT or HBT formed according to the method of FIG. 2.

At least one mask layer 103 can be formed on the top surface of the semiconductor substrate 101 (206) and an opening 113 can be formed in the mask layer 103 (208, see FIG. 4). Specifically, mask layer(s) 103 can be deposited onto the top surface of the substrate 101 covering the STI region 102 and collector region 120. In one embodiment, the mask layer(s) 103 can comprise a first mask layer on top of a second mask layer. The first mask layer can comprise an un-doped polycrystalline semiconductor mask layer comprising polycrystalline silicon or a polycrystalline silicon-based compound containing other Group IV elements, such as germanium or carbon. The second mask layer can comprise a dielectric mask layer (e.g., a silicon dioxide mask layer). Additionally, an opening 113 (i.e., a trench) can be formed in the mask layer(s) 103 using, for example, conventional lithographic patterning and etch techniques such that the opening 113 exposes the entire top surface of the collector region 120 and further exposes a portion of the top surface of the STI region 102 immediately adjacent to (i.e., laterally surrounding) the collector region 120.

Following formation of the opening 113 at process 208, a pre-cleaning process can be performed in preparation for a subsequent seed layer epitaxial deposition process (210). For example, the wafer can be cleaned using dilute hydrofluoric acid (HF) solution to remove native oxide prior wafer loading through a loadlock for epitaxial deposition. Additionally, a high temperature hydrogen prebake process can be performed (e.g., at approximately 80° C. or above for approximately 2 minutes) in order to further remove surface contaminants.

The method can further comprise forming a conformal seed layer 104 (e.g., a relatively thin silicon layer) on the mask layer 103 and lining the opening 113 such that covers the top surface of the STI region 102 and collector region 120 within the opening 112 (212). This seed layer 104 can specifically be formed at process 212 such that it has a first monocrystalline center section 121 and a first polycrystalline outer section 122, wherein the first monocrystalline center section 121 is aligned above and immediately adjacent to the collector region 120 and further extends laterally onto the STI region 102 such that it is wider than the collector region 120 below and wherein the first polycrystalline outer section 122 is positioned laterally adjacent to the first monocrystalline center section 121.

Figure 5:
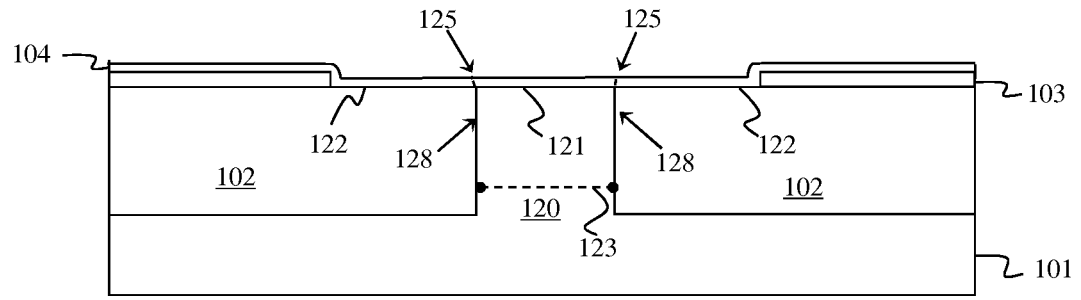
FIG. 5 is a cross-section diagram illustrating a partially completed BJT or HBT formed according to the method of FIG. 2.

The formation of such a conformal seed layer 104 at process 212 can be achieved, for example, by forming a relatively thin semiconductor layer (e.g., a silicon layer with a maximum thickness of less than 200 nm), using a non-selective epitaxial deposition process, such that the interface 125 between monocrystalline and polycrystalline semiconductor material is aligned above the interface 128 between the collector region 120 and the STI region 102 (214, see FIG. 5).

Figure 6:
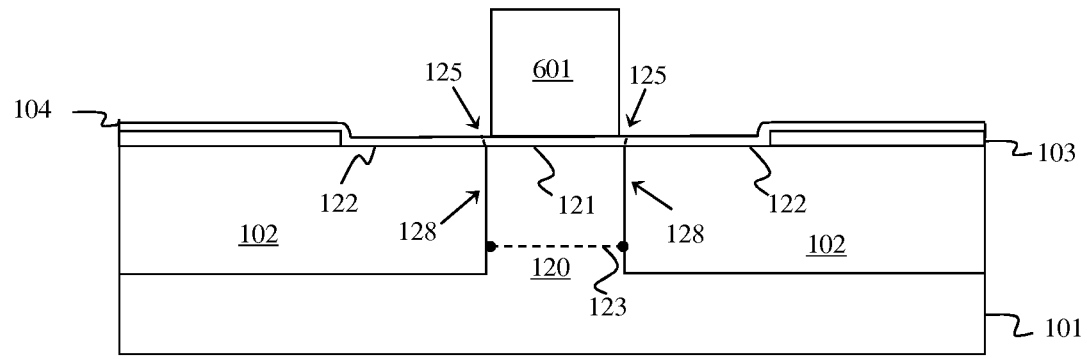
FIG. 6 is a cross-section diagram illustrating a partially completed BJT or HBT formed according to the method of FIG. 2.
Figure 7:
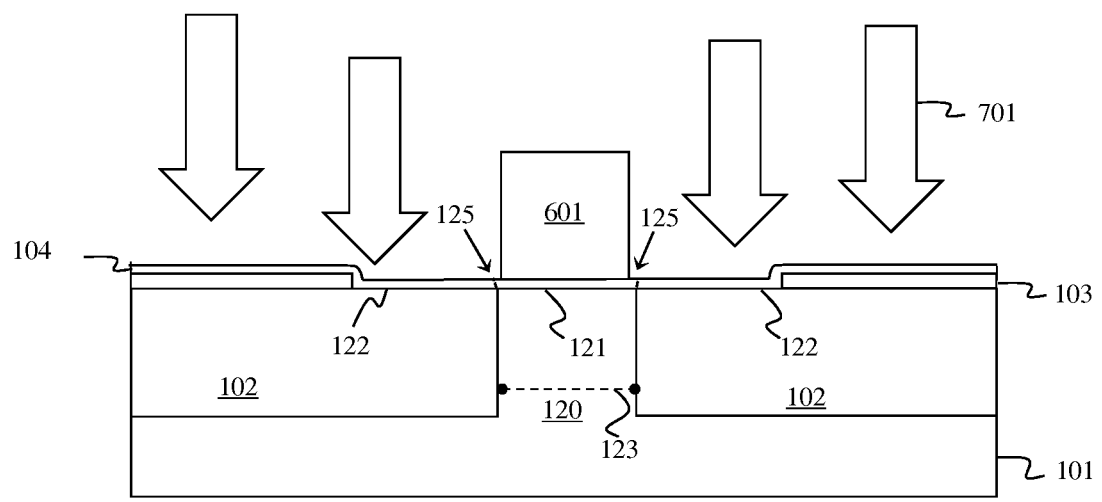
FIG. 7 is a cross-section diagram illustrating a partially completed BJT or HBT formed according to the method of FIG. 2.

Next, a mask 601 (e.g., a patterned resist layer) can be formed on the portion of the semiconductor layer 104 above the collector region 120 (216, see FIG. 6) and the exposed portion of the seed layer 104 above the STI region 102 and seed layer 104 can be amorphized (218, see FIG. 7). Specifically, inert amorphizing ions can be implanted into the exposed portions of the seed layer 104 (e.g., with an implant energy of 10-500 keV at a dose of approximately $1 \times 10^{14}$ atoms/$cm^2$). The inert amorphization ions can comprise, for example, any of the Group IV ions (e.g., silicon ions, germanium ions, carbon ions or tin ions), any of the Group 0 nobel gas ions (e.g., argon ions, krypton ions, xenon ions, and neon ions), nitrogen ions, oxygen ions, or any combination thereof. Implantation of the inert amorphizing ions can be performed in order to convert the exposed portions of the seed layer 104 from polycrystalline semiconductor material to amorphous semiconductor material. After the exposed portions of the seed layer 104 are amorphized, the mask 601 can be removed.

Figure 8:
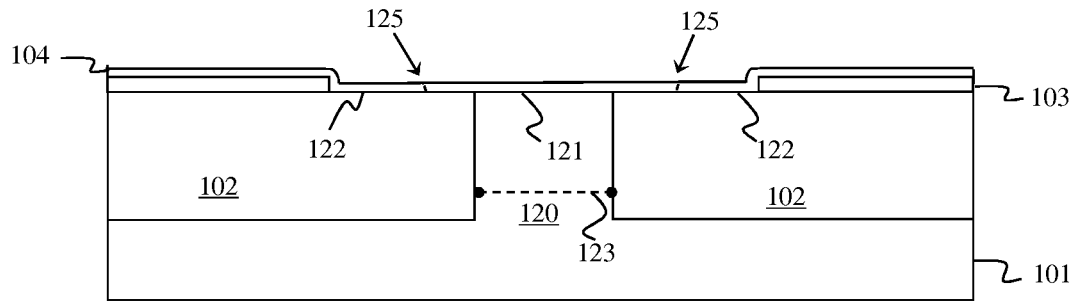
FIG. 8 is a cross-section diagram illustrating a partially completed BJT or HBT formed according to the method of FIG. 2.

Finally, a solid phase epitaxy regrowth process (i.e., a recrystallization process) can be performed in order to move the interface 125 between the monocrystalline and polycrystalline semiconductor material within the seed layer 104 such that it is over the STI region 102, as shown, or optionally over the mask layer 103 and, thereby offset vertically from the collector region 120 (220, see FIG. 8). Specifically, during this solid phase epitaxy regrowth process, the amorphized portions of the seed layer 104 can be recrystallized and, in doing so, the interface 125 between the monocrystalline and polycrystalline semiconductor material can be moved so that it is no longer aligned with the interface 128 between the collector region 120 and STI region 102 but is instead over the STI region 102, as shown, or over the mask layer 103. This solid phase epitaxy regrowth process can comprise, for example, a low temperature thermal anneal process (e.g., a thermal anneal between 400 and 650° C. performed over a period of 30 min to 8 hours). Alternatively, this solid phase epitaxy regrowth process can comprise a laser anneal process, in which a laser pulse of very high power density and very short duration melts the silicon to a very shallow depth. This depth is designed to be greater than the implantation damage region, and all defects can be completely removed following the very rapid epitaxial regrowth. In any case, such a solid phase epitaxy regrowth process (e.g., by thermal or laser anneal) can be performed for a predetermined amount of time so that the width 124 of the resulting first monocrystalline center section 121 of the seed layer 104 is greater than the width 123 of the collector region 120 below, as defined by the STI region 102, by a predetermined number of units distance (e.g., by 40 nm, by 60 nm, by 80 nm, etc.).

Figure 9:
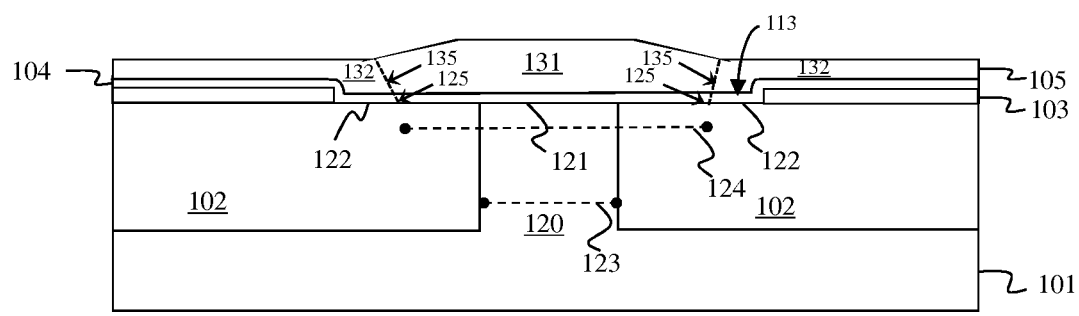
FIG. 9 is a cross-section diagram illustrating a partially completed BJT or HBT formed according to the method of FIG. 2.

Next, an intrinsic base layer 105 can be formed above and immediately adjacent to the seed layer 104 (222, see FIG. 9). In the case of a BJT, the intrinsic base layer 105 formed can comprise, for example, a silicon intrinsic base layer. In the case of an HBT, the intrinsic base layer 105 formed can comprise, for example, a silicon germanium intrinsic base layer, a silicon germanium intrinsic base layer doped with carbon or a silicon germanium carbide intrinsic base layer. In any case, this intrinsic base layer 105 can be formed, for example, by performing a non-selective epitaxy process (e.g., a non-selective, ultra high-vacuum/chemical vapor deposition (UHV/CVD), low-temperature epitaxy (LTE) process). Those skilled in the art will recognize that, as a result of such a non-selective epitaxy process, the crystalline structure of the intrinsic base layer 105 will typically mimic that of the seed layer 104 below. Thus, the intrinsic base layer 105 will be formed such that it comprises a second monocrystalline center section 131 and a second polycrystalline outer section 132. The second monocrystalline center section 131 will be aligned above and approximately equal in size to the first monocrystalline center section 121 of the seed layer 104 such that it is also wider than the collector region 120 below. The second polycrystalline outer section 132 will be on the first polycrystalline outer section 122 of the seed layer 104 and positioned laterally adjacent to the second monocrystalline center section 131. Furthermore, the second polycrystalline outer section 132 will typically be less thick than the second monocrystalline center section 131, as a result of the faster epitaxial growth rate of monocrystalline semiconductor material as compared to polycrystalline semiconductor material. Finally, deposition of the intrinsic base layer 105 may begin without doping such that the resulting intrinsic base layer has a relatively thin un-doped lower portion. Subsequently, in-situ doping with a first conductivity type dopant (e.g., a P-type dopant) can be performed so that the resulting intrinsic base layer has a relatively thin doped upper portion with the first type conductivity (e.g., P-type conductivity).

Figure 10:
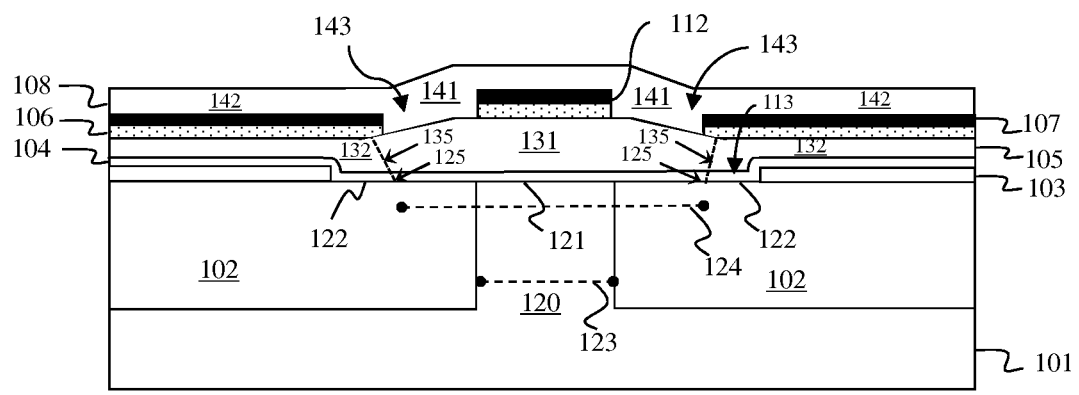
FIG. 10 is a cross-section diagram illustrating a partially completed BJT or HBT formed according to the method of FIG. 2.

The method can further comprise forming an extrinsic base layer 108 above the intrinsic base layer 105 (224, see FIG. 10).

For example, a stack of one or more additional mask layers can be formed on the intrinsic base layer 105. Specifically, a dielectric mask layer 106 can be formed (e.g., deposited) immediately adjacent to the intrinsic base layer 105 and can comprise, for example, a silicon dioxide ($SiO_2$) layer, a silicon nitride (SiN) layer, a silicon oxynitride (SiNO), a high-K dielectric layer (e.g., hafnium oxide ($HFO_2$), zirconium oxide (ZrO2), etc.), or any other suitable dielectric layer capable of blocking dopant diffusion. A polysilicon mask layer 107 or other suitable mask layer can be positioned above the dielectric mask layer 106. Next, an extrinsic base-to-intrinsic base link-up region opening 143 can be formed in the stack (e.g., using conventional lithographic patterning and etch techniques). This opening 143 can specifically be formed so that it is aligned over an edge portion of the second monocrystalline center section 131 of the intrinsic base layer 105 only. As a result, a first portion 112 of the stack 106, 107 (also referred to herein as an emitter opening landing pad) remains on the intrinsic base layer 105 over an inner portion of the second monocrystalline center section 131 and aligned above the collector region 120 and a second portion of the stack 106, 107 remains on the intrinsic base layer 105 over the second polycrystalline outer section 132. Then, the raised extrinsic base layer 108 can be formed on the stack 106, 107 and in the opening 143 on the exposed edge portion of the second monocrystalline center section 131 of the intrinsic base layer 105.

Specifically, an epitaxial semiconductor layer (e.g., an epitaxial silicon layer in the case of either a BJT or HBT) can be formed using a non-selective low-temperature epitaxy (LTE) process. Those skilled in the art will recognize that as a result of such an epitaxy process the crystalline structure of the resulting extrinsic base layer 108 will mimic the crystalline structure of the material below. Thus, the extrinsic base layer 108 will have a third monocrystalline section 141 (i.e., a monocrystalline extrinsic base-to-intrinsic base link-up region) filling the opening 143 such that it is aligned above and immediately adjacent to (i.e., in contact with) the edge portion of the second monocrystalline center section 131 of the intrinsic base layer 105, and thereby above the STI region 102 and offset vertically from the collector region 120. The extrinsic base layer 108 will also have a third polycrystalline outer section 142 positioned laterally adjacent to the third monocrystalline section 141 and above the stack 106, 107.

This extrinsic base layer 108 can be either in-situ doped or subsequently implanted with a first type conductivity dopant (e.g., a P-type dopant) so that it has the first type conductivity (e.g., P-type). Typically, the extrinsic base layer 108 will be doped with a relatively high concentration of the dopant as compared to the intrinsic base layer 105.

After the extrinsic base layer 108 is formed at process 224, additional process steps can be performed in order to complete the transistor structure 100 (226, see FIG. 1). These additional process steps can comprise conventional BJT and HBT process steps for forming additional features including, but not limited to, the following features described in detail above: additional dielectric layer(s), dielectric spacer(s), an emitter layer, metal silicide layers, contacts, etc. Various different techniques for forming these features are well known in the art and, thus, are omitted from this specification in order to allow the reader to focus on the salient aspects of the method embodiments. However, it should be understood that any of these various techniques could be incorporated into the different method embodiments disclosed.

The above-described method embodiments allow the transistor 100 of FIG. 1 to be formed with a relatively narrow collector region 120, thereby increasing the space between the extrinsic base layer 108 and the collector region 120 and reducing their overlapping region. As a result, base-collector junction capacitance $C_{bc}$ is reduced and, consequently, the maximum oscillation frequency $f_{max}$ is also increased. Furthermore, this reduced $C_{bc}$ is achieved without requiring a corresponding decrease in the size of the monocrystalline center section 131 of the intrinsic base layer 105, the emitter landing pad 112 or the emitter layer 150.

It should be noted that in the structure and method embodiments described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (MG), whereas a gallium nitride (GaN)-based semiconductor material having an N-type conductivity is typically doped with silicon (Si). Those skilled in the art will also recognize that different conductivity levels of the different transistor components will depend upon the relative concentration levels of the dopants. For example, a higher P-type conductivity level in the raised extrinsic base layer 108 as compared to the intrinsic base layer 105 can be achieved using a higher relative dopant concentration.

It should further be understood that the terminology used herein is for the purpose of describing particular embodiments only and is not intended to be limiting of the embodiments. As used herein, the singular forms "a", "an" and "the" are intended to include the plural forms as well, unless the context clearly indicates otherwise. It should further be understood that the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. In addition, it should be understood that terms such as "right", "left", "vertical", "horizontal", "top", "bottom", "upper", "lower", "under", "below", "underlying", "over", "overlying", "parallel", "perpendicular", etc., used herein are relative locations as they are oriented and illustrated in the drawings (unless otherwise indicated). Furthermore, terms such as "touching", "on", "in direct contact", "abutting", "directly adjacent to", "immediately adjacent to", etc., are intended to mean that at least one element physically contacts another element (without other elements separating the described elements).

It should further be understood that the method embodiments, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Finally, it should be understood that the corresponding structures, materials, acts, and equivalents of all means or step plus function elements in the claims below are intended to include any structure, material, or act for performing the function in combination with other claimed elements as specifically claimed. The above description of the embodiments is presented for purposes of illustration and is not intended to be exhaustive or limiting. Many modifications and variations to the disclosed embodiments will be apparent to those of ordinary skill in the art without departing from the scope and spirit of the disclosed embodiments.

Therefore, disclosed above are embodiments of a transistor (e.g., bipolar junction transistor (BJT) or a heterojunction bipolar transistor (HBT)) and a method of forming the transistor with an in-substrate collector region having reduced dimensions (i.e., a relatively narrow in-substrate collector region) for reduced base-collector junction capacitance $C_{bc}$. Specifically, in the embodiments, the transistor can have, within a semiconductor substrate, a collector region positioned laterally adjacent to a trench isolation region. A relatively thin un-doped or low-doped seed layer can cover the trench isolation region and collector region. This seed layer can comprise a monocrystalline center section and a polycrystalline outer section. The monocrystalline center section can be aligned above and wider than the collector region (e.g., due to a solid phase epitaxy regrowth process performed during device fabrication). An intrinsic base layer can be epitaxially deposited on the seed layer such that the resulting intrinsic base layer similarly has a monocrystalline center section that is aligned above and wider than the collector region. An extrinsic base layer can be above the intrinsic base layer and can have a monocrystalline extrinsic base-to-intrinsic base link-up region that is offset vertically from the collector region. In such a transistor, narrowing the collector region increases the space between the extrinsic base layer and the collector region. As a result, base-collector junction capacitance $C_{bc}$ is reduced and, consequently, the maximum oscillation frequency $f_{max}$ is also increased. Furthermore, this reduced $C_{bc}$ is achieved without requiring a corresponding decrease in the size of the monocrystalline center section of the intrinsic base layer, emitter landing pad or emitter layer.

What is claimed is:

1. A transistor comprising:
   a trench isolation region in a semiconductor substrate;
   a collector region in said substrate positioned laterally adjacent to said trench isolation region;
   a seed layer comprising:
     a first monocrystalline center section covering said collector region and further extending laterally onto said trench isolation region; and
     a first polycrystalline outer section positioned laterally adjacent to said first monocrystalline center section; and
   an intrinsic base layer adjacent to said seed layer,
   said first polycrystalline outer section and an edge portion of said first monocrystalline center section above said trench isolation region being doped with inert ions.

2. The transistor of claim 1, said first monocrystalline center section being wider than said collector region by a predetermined number of units distance, said predetermined number of units distance being at least 40 nm.

3. The transistor of claim 1, said seed layer comprising epitaxial silicon.

4. The transistor of claim 1, said intrinsic base layer comprising any of epitaxial silicon, epitaxial silicon germanium, epitaxial silicon germanium doped with carbon and epitaxial silicon germanium carbide.

5. A heterojunction bipolar transistor comprising:
a trench isolation region in a semiconductor substrate;
a collector region in said substrate positioned laterally adjacent to said trench isolation region;
a seed layer comprising:
a first monocrystalline center section covering said collector region and further extending laterally onto said trench isolation region; and
a first polycrystalline outer section positioned laterally adjacent to said first monocrystalline center section; and
an intrinsic base layer adjacent to said seed layer, said intrinsic base layer comprising any one of a silicon germanium intrinsic base layer, a silicon germanium intrinsic base layer doped with carbon and a silicon germanium carbide intrinsic base layer,
said first polycrystalline outer section and an edge portion of said first monocrystalline center section above said trench isolation region being doped with inert ions.

6. The heterojunction bipolar transistor of claim 5, said first monocrystalline center section being wider than said collector region by a predetermined number of units distance, said predetermined number of units distance being at least 40 nm.

7. The heterojunction bipolar transistor of claim 5, said seed layer comprising epitaxial silicon.

8. A transistor comprising:
a trench isolation region in a semiconductor substrate;
a collector region in said substrate positioned laterally adjacent to said trench isolation region;
a seed layer comprising:
a first monocrystalline center section covering said collector region and further extending laterally onto said trench isolation region; and
a first polycrystalline outer section positioned laterally adjacent to said first monocrystalline center section;
an intrinsic base layer adjacent to said seed layer, said intrinsic base layer comprising:
a second monocrystalline center section aligned above and approximately equal in size to said first monocrystalline center section such that said second monocrystalline center section is wider than said collector region; and
a second polycrystalline outer section on said first polycrystalline outer section and positioned laterally adjacent to said second monocrystalline center section;
an extrinsic base layer above said intrinsic base layer; and
an emitter layer extending vertically through said extrinsic base layer to an inner portion of said second monocrystalline center section of said intrinsic base layer above said collector region,
said emitter layer being electrically isolated from said extrinsic base layer, and
said extrinsic base layer having a monocrystalline link-up region in contact with an edge portion of said second monocrystalline center section of said intrinsic base layer and offset vertically from said collector region in said substrate below.

9. The transistor of claim 8, said first monocrystalline center section being wider than said collector region by a predetermined number of units distance, said predetermined number of units distance being at least 40 nm.

10. The transistor of claim 8, said seed layer comprising epitaxial silicon.

11. The transistor of claim 8, said intrinsic base layer comprising any of epitaxial silicon, epitaxial silicon germanium, epitaxial silicon germanium doped with carbon and epitaxial silicon germanium carbide.

12. The transistor of claim 8, said first polycrystalline outer section and an edge portion of said first monocrystalline center section above said trench isolation region being doped with inert ions.

13. A heterojunction bipolar transistor comprising:
a trench isolation region in a semiconductor substrate;
a collector region in said substrate positioned laterally adjacent to said trench isolation region;
a seed layer comprising:
a first monocrystalline center section covering said collector region and further extending laterally onto said trench isolation region; and
a first polycrystalline outer section positioned laterally adjacent to said first monocrystalline center section;
an intrinsic base layer adjacent to said seed layer, said intrinsic base layer comprising any one of a silicon germanium intrinsic base layer, a silicon germanium intrinsic base layer doped with carbon and a silicon germanium carbide intrinsic base layer and said intrinsic base layer further comprising:
a second monocrystalline center section aligned above and approximately equal in size to said first monocrystalline center section such that said second monocrystalline center section is wider than said collector region; and
a second polycrystalline outer section on said first polycrystalline outer section and positioned laterally adjacent to said second monocrystalline center section;
an extrinsic base layer above said intrinsic base layer; and
an emitter layer extending vertically through said extrinsic base layer to an inner portion of said second monocrystalline center section of said intrinsic base layer above said collector region,
said emitter layer being electrically isolated from said extrinsic base layer, and
said extrinsic base layer having a monocrystalline link-up region in contact with an edge portion of said second monocrystalline center section of said intrinsic base layer and offset vertically from said collector region in said substrate below.

14. The heterojunction bipolar transistor of claim 13, said first monocrystalline center section being wider than said collector region by a predetermined number of units distance, said predetermined number of units distance being at least 40 nm.

15. The heterojunction bipolar transistor of claim 13, said seed layer comprising epitaxial silicon.

16. The heterojunction bipolar transistor of claim 13, said first polycrystalline outer section and an edge portion of said first monocrystalline center section above said trench isolation region being doped with inert ions.

\* \* \* \* \*